(12) United States Patent
Pangal et al.

(10) Patent No.: US 8,832,530 B2
(45) Date of Patent: Sep. 9, 2014

(54) TECHNIQUES ASSOCIATED WITH A READ AND WRITE WINDOW BUDGET FOR A TWO LEVEL MEMORY SYSTEM

(71) Applicant: Intel Corporation, Santa Clara, CA (US)

(72) Inventors: Kiran Pangal, Fremont, CA (US); Prashant Damle, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 13/627,380

(22) Filed: Sep. 26, 2012

(65) Prior Publication Data
US 2014/0089762 A1    Mar. 27, 2014

(51) Int. Cl.
*G11C 29/00* (2006.01)
*G06F 11/10* (2006.01)

(52) U.S. Cl.
CPC ........ *G06F 11/1068* (2013.01); *G06F 11/1008* (2013.01); *G06F 11/1072* (2013.01)
USPC .................. 714/773; 714/719; 365/185.24

(58) Field of Classification Search
CPC ............ G06F 11/1008; G06F 11/1068; G06F 11/1072
USPC ................ 714/719, 773; 365/185.12, 185.24
See application file for complete search history.

(56) References Cited

U.S. PATENT DOCUMENTS

| 2008/0025102 | A1* | 1/2008 | Chen et al. ............... 365/185.24 |
| 2010/0131809 | A1* | 5/2010 | Katz ............................. 714/719 |
| 2010/0172180 | A1* | 7/2010 | Paley et al. .............. 365/185.12 |
| 2011/0060866 | A1* | 3/2011 | Kawano et al. ............... 711/103 |
| 2011/0099418 | A1  | 4/2011 | Chen |
| 2011/0167206 | A1  | 7/2011 | Bovino et al. |
| 2012/0198166 | A1  | 8/2012 | Damodaran et al. |

OTHER PUBLICATIONS

International Search Report and Written Opinion received for PCT Patent Application No. PCT/US2013/047453, mailed Nov. 7, 2013, 10 pages.

* cited by examiner

*Primary Examiner* — Sam Rizk
(74) *Attorney, Agent, or Firm* — Kacvinsky Daisak Bluni PLLC

(57) ABSTRACT

Techniques associated with a read and write window budget for a two level memory (2LM) system may include establishing a read and write window budget for the 2LM system that includes a first level memory and a second level memory. The established read and write window budget may include a combination of a first set of memory addresses and a second set of memory addresses of the second level of memory. The first set of memory addresses may be associated with non-volatile memory cells having wider cell threshold voltage distributions compared to cell threshold voltage distributions for non-volatile memory cells associated with the second set of memory addresses. According to some examples, the established read and write window budget may be part of a strategy to meet both a completion time threshold for a given amount of memory and an acceptable error rate threshold for the given amount of memory when fulfilling read or write requests to the second level memory.

24 Claims, 10 Drawing Sheets

Storage Medium 1000

*Computer Executable Instructions for 900*

FIG. 10

Computing Platform 1100

Processing Component 1140
- Apparatus 800
- Storage Medium 1000

2LM System 1130
- Apparatus 800

Other Platform Components 1150

Communications Interface 1160

FIG. 11

TECHNIQUES ASSOCIATED WITH A READ AND WRITE WINDOW BUDGET FOR A TWO LEVEL MEMORY SYSTEM

BACKGROUND

Computing devices may use a two level memory (2LM) system as a form of main memory. A first level of a 2LM system may also be referred to as "near memory" and the second level may be referred as "far memory". The first level memory typically has a smaller memory capacity compared to the second level memory. The first level memory may include types of memory that have faster write and/or read completion times compared to the types of memory included in the second level memory. Thus, the first level memory may serve as a write and/or read cache for the second level memory in a 2LM system. Overall write/read completion times using both levels of memory are important considerations when determining both the relative capacities of each level and types of memories included in each level.

BRIEF DESCRIPTION OF THE DRAWINGS

FIG. 10 illustrates an example storage medium.
FIG. 11 illustrates an example computing platform.

DETAILED DESCRIPTION

As contemplated in the present disclosure, overall write/read completion times using both levels of memory in a 2LM system are important considerations when determining both the relative capacities of each level and types of memories included in each level. For example, types of memory used for the first level memory may include volatile memories such as dynamic random access memory (DRAM) or static random access memory (SRAM). Types of memory included in the second level may typically include volatile memory or may include non-volatile memory such as phase change memory (PCM), PCM and switch (PCMS), flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM) or electrically erasable programmable read-only memory (EEPROM). Volatile memories typically have faster write completion times but may be more expensive to manufacture and also require more energy to operate. Non-volatile memories typically have slower write/read completion times, but may cost less to manufacture and require much less energy to operate.

A balance between costs and performance is often struck to determine the relative size of and/or types of memories in the first and second levels of a 2LM system. Efforts are continually being made to increase the relative size of non-volatile memory in the second level memory as compared to volatile memory in the first level memory. However, as write/read completion times may be reduced while using some types of non-volatile memories such as phase change memory, writing errors may also increase. Techniques to reduce writing errors such as error correction codes may be implemented but these techniques may increase write/read completion times. Hence, there is a need for ways to balance acceptable write/read completion times with an acceptable amount of errors for types of second level memories included in 2LM systems. It is with respect to these and other challenges that the examples described herein are needed.

In some examples, techniques associated with a read and write window budget for a 2LM system may be implemented. These techniques may include establishing a read and write window budget for the 2LM system that includes a first level memory and a second level memory. The read and write window budget may include a combination of a first set of memory addresses and a second set of memory addresses of the second level memory. The first set of memory addresses may be associated with non-volatile memory cells having wider cell threshold voltage distributions compared to cell threshold voltage distributions for non-volatile memory cells associated with the second set of memory addresses. According to some examples, a write request to write data to the 2LM system may be received and the data may be written to the second level memory based on the read and write window budget.

Figure 1:
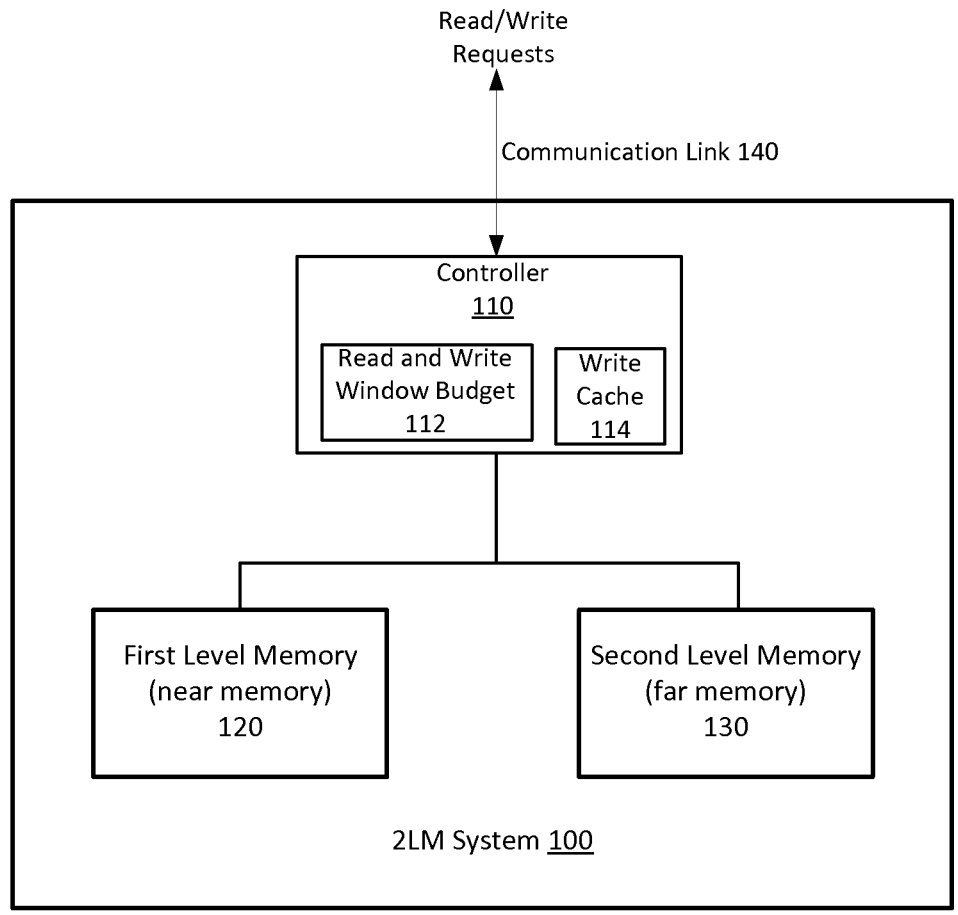
FIG. 1 illustrates an example two level memory (2LM) system.

FIG. 1 illustrates an example 2LM system 100. As shown in FIG. 1, 2LM system 100 includes a controller 110, a first level memory 120 and a second level memory 130. According to some examples, controller 110 may receive and/or fulfill read/write requests via communication link 140.

Although not shown in FIG. 1, in some examples, communication link 140 may communicatively couple controller 110 to elements or features associated with an operating system for a computing device. For these examples, 2LM system 100 may serve as main memory for the operating system. Also, controller 110 may include logic and/or features to handle read/write requests to 2LM system 100 with first level memory 120 functioning as a near memory and second level memory 130 functioning as a far memory.

In some examples, first level memory 120 may include volatile types of memory (e.g., DRAM, SRAM, etc.) and may function as a write/read cache when data is read from or written to 2LM system 100. For these examples, second level memory 130 may include non-volatile types of memory (e.g., NOR flash memory, NAND flash memory, PCM, PCMS, SONOS memory, polymer memory, nanowire, FeRAM, ferroelectric memory, etc.) having a substantially larger memory capacity than the volatile types of memory included in first level memory 120. Thus, data may be substantially read from and written to memory addresses associated with non-volatile memory cells maintained at second level memory 130.

In some examples, although FIG. 1 depicts two levels of memory, this disclosure contemplates a memory system having multiple memory layers that include more than two memory layers. The multiple memory layers may include combinations of types of memory from either non-volatile types of memory or volatile types of memory. For example, a first layer may include volatile types of memory and subsequent layers may include the same or different types of non-volatile memory such as NAND flash memory, PCM or ferroelectric memory.

According to some examples, as described in more detail below, controller 110 may include logic and/or features to establish read and write window budget 112 based on meeting both completion time and acceptable error rate requirements for fulfilling read or write requests. These requirements may be dictated by memory capability needs for the operating system possibly using 2LM system 100 as a form of main memory. Completion time requirements may be reflected in memory bandwidth or a completion time threshold for a given amount of memory. For example, memory bandwidth may be measured in megabytes per second (MB/s) and a given completion time threshold may be any number of MB/s. Error rate requirements may be reflected in a bit error rate (BER) and an error threshold may be determined based on any number of acceptable errors for a given amount of memory.

In some examples, establishment of read and write window budget 112 by controller 110 may manifest a strategy to maximize write completion times while attempting to minimize error rates. One way to reduce errors is to implement error correction coding (ECC). In addition to ECC, as described more below, a multiple pulse-verification algorithm may be used to narrow cell threshold voltage (Vt) distributions for non-volatile memory cells. However, implementing ECC and using the multiple pulse-verification algorithm may increase write completion times.

According to some example, read and write window budget 112 may be established by controller 110 that indicates a strategy to service a write request by writing data to a first set of memory addresses associated with non-volatile memory cells that may be used to store the data without error correction (e.g., ECC) and subsequently writing at least a portion of the data to a second set of memory addresses associated with non-volatile memory cells that may store at least a portion of the data while implementing ECC and using a multiple pulse-verification algorithm to narrow cell Vt distributions.

In some examples, controller 110 may include logic and/or features to establish read and write window budget 112 for 2LM system 100 that includes a combination of a first set of memory addresses and a second set of memory addresses of second level memory 130. For these examples, the first set of memory addresses may be associated with non-volatile memory cells having wider cell Vt distributions compared to cell Vt distributions for non-volatile memory cells associated with the second set of memory addresses. The differences in the widths of the cell Vt distributions may be based on whether data is written to the first and second memory addresses using either a foreground write process or a background write process. As described more below, the foreground write process includes no error correction while the background write process includes implementing ECC and using a multiple pulse-verification algorithm to possible narrow cell Vt distributions for non-volatile memory cells.

According to some examples, as shown in FIG. 1, controller 110 may include a write cache 114. For these examples, controller 110 may include logic and/or features to manage or maintain write cache 114. As described more below, write cache 114 may be capable of at least temporarily storing data being written to second level memory 130 via a background write process. Write cache 114 may include volatile or non-volatile types of memory and have a relatively small memory capacity compared to second level memory 130.

Figure 2:
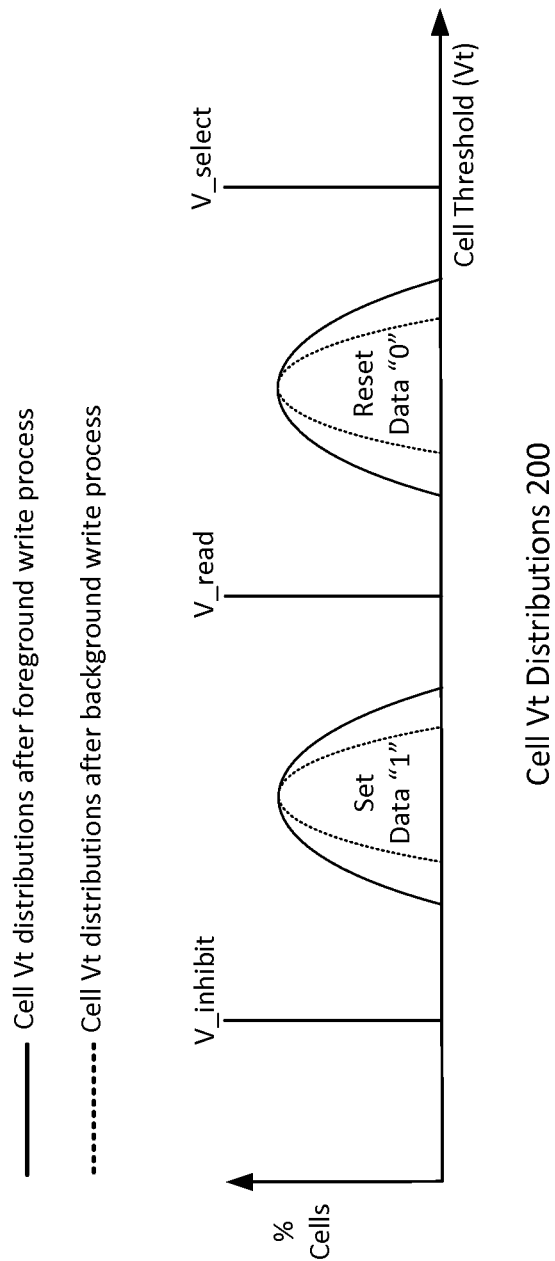
FIG. 2 illustrates example cell threshold voltage (Vt) distributions.

FIG. 2 illustrates example cell Vt distributions 200. In some examples, as shown in FIG. 2, cell Vt distributions 200 shows possible comparisons in widths for cell Vt distributions after foreground and background write processes. Generally, narrower widths for cell Vt distributions reduce the probability a cell value read from or written to that cell is incorrect. For example, the closer the edges of the curves for a value of "1" and a value of "0" are relative to each other, the higher the probability a reading error may occur. As a result, narrowing the width of the cell Vt distributions for non-volatile memory cells may lead to a corresponding reduction in the BER for reads or writes to these non-volatile memory cells.

According to some examples, use of a foreground write process that includes no error correction versus use of a background write process that implements ECC and uses a multiple pulse-verification algorithm may result in the disparity of cell Vt distributions shown in FIG. 2. The comparison of the cell Vt distributions merely depict differences to facilitate a description of the possible effects of example foreground and background write processes. This disclosure contemplates relative differences in cell Vt distributions that may be greater or less than the difference depicted in FIG. 2.

Figure 3:
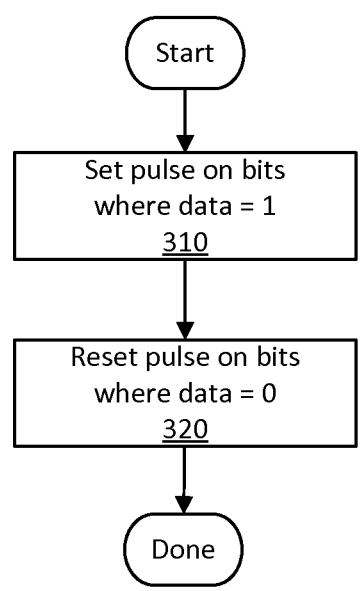
FIG. 3 illustrates an example foreground write process.

FIG. 3 illustrates an example foreground write process 300. In some examples, controller 110 may include logic and/or features to implement foreground write process 300 according to read and write window budget 112. For these examples, the process may start responsive to receiving a write request to write data to 2LM system 100. As mentioned above, read and write window budget 112 may include a combination of a first set of memory addresses and a second set of memory addresses of second level memory 130. Also as mentioned above, the first set of memory addresses may be associated with non-volatile memory cells having wider cell Vt distributions compared to cell Vt distributions for non-volatile memory cells associated with the second set of memory addresses. According to some examples, writing the data to second level memory 130 based on read and write window budget 112 may include writing the data included in the write request to the first set of memory addresses using foreground write process 300.

Moving from the start to block 310, controller 110 may include logic and/or features to cause a set pulse on bits of non-volatile memory cells where data=1 for those non-volatile memory cells of second level memory 130 associated with the first set of memory addresses. In some examples, this step of foreground write process 300 includes no error correction and may result in relatively quick write completion times to these memory cells where data=1.

Proceeding from block 310 to block 320, controller 110 may include logic and/or features to cause a reset pulse on bits of non-volatile memory cells where data=0 for those non-volatile memory cells of second level memory 130 associated with the first set of memory address. In some examples, this step of foreground write process 300 includes no error correction and may result in relatively quick write completion times to these memory cells where data=0. Foreground write process 300 then comes to an end.

Figure 4:
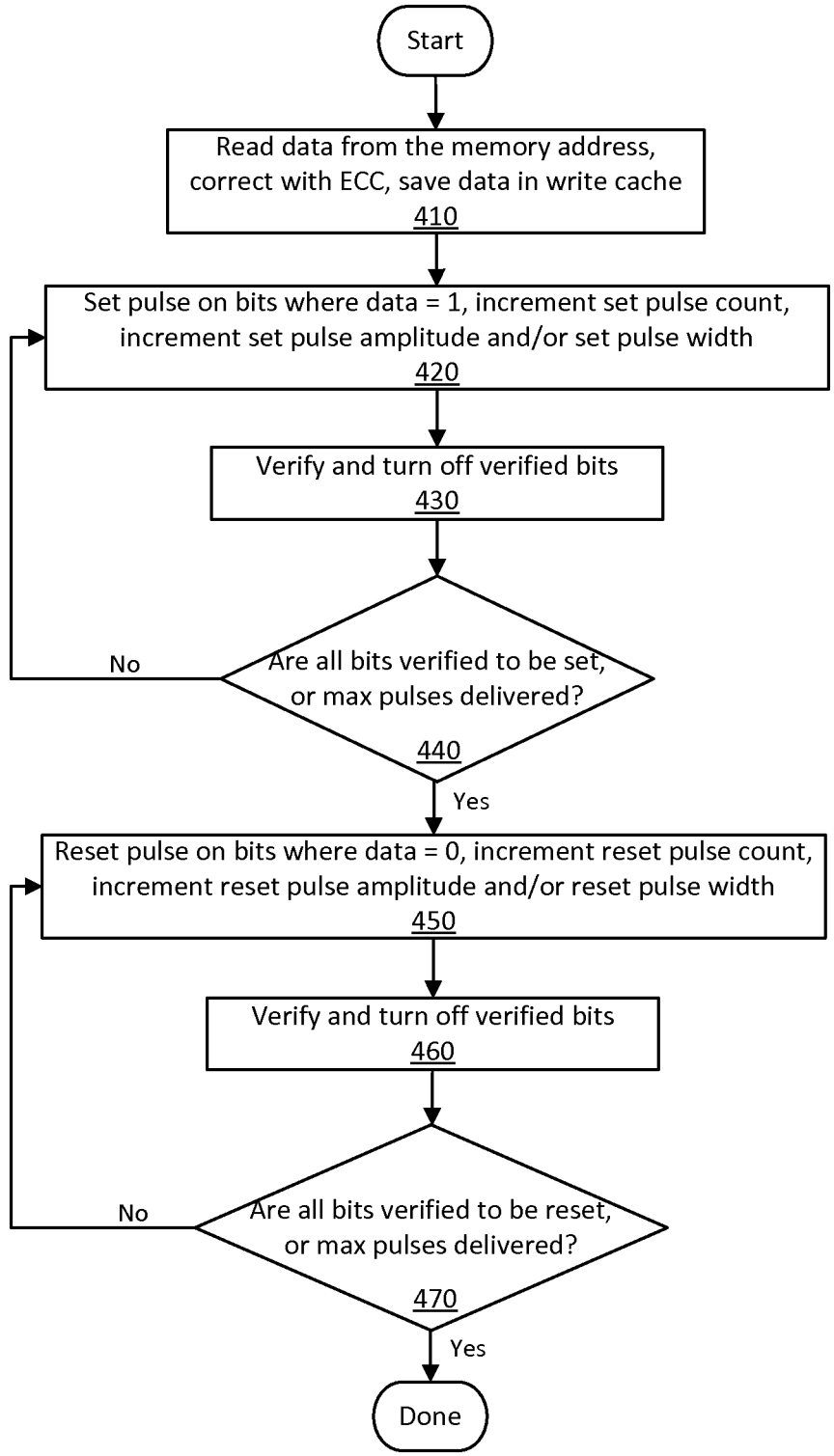
FIG. 4 illustrates an example background write process.

FIG. 4 illustrates an example background write process 400. In some examples, controller 110 may include logic and/or features to implement background write process 400 according to read and write window budget 112. For these examples, the process may start following completion of foreground write process 300 that included writing data responsive to receiving a write request to write data to 2LM system 100. As mentioned above, read and write window budget 112 may include writing to a combination of a first set of memory addresses and a second set of memory addresses of second level memory 130.

According to some examples, the second set of memory addresses included in read and write window budget may be associated with non-volatile memory cells having narrower cell Vt distributions compared to cell Vt distributions for non-volatile memory cells associated with the first set of memory addresses used to write the data received in the write request. According to some examples, writing the data to second level memory 130 based on read and write window budget 112 may include writing at least a portion of the data included in the write request to non-volatile memory cells associated with the second set of memory addresses using background write process 400. The at least a portion of the data may be written based on a read and write window budget 112 that balances reduced errors with increased write completion times.

Moving from the start to block 410, controller 110 may include logic and/or features to cause data to be read from a memory address associated with a non-volatile memory cell. In some examples, the memory address may be included within the first set of memory addresses via which data was written to as mentioned above for foreground process 300. Reading data from the memory address may include reading the data from a non-volatile memory cell maintained at second level memory 130. Once the data is read from the non-volatile memory cell, an ECC scheme may be implemented (e.g., such as Reed-Solomon) to correct errors in the data.

According to some examples, controller 110 may include logic and/or features to cause the error corrected data to be saved to write cache 114. For these examples, write cache 114 may be capable of at least temporarily storing the error corrected data.

Proceeding from block 410 to block 420, controller 110 may include logic and/or features to cause a multi pulse-verification algorithm to be used that starts at block 420. The multi pulse-verification algorithm may be used in order to narrow cell Vt distributions for the non-volatile memory cell. In some examples, a set pulse may be asserted on bits for the non-volatile memory cell where data=1. A set pulse count may then be incremented, a set pulse amplitude and/or a set pulse width may also be incremented.

Proceeding from block 420 to block 430, controller 110 may include logic and/or features to cause the corrected data in the first level memory 120 to be used to verify bits for the non-volatile memory cell where data=1 and then cause verified bits to be turned off.

Proceeding from block 430 to decision block 440, controller 110 may include logic and/or features to determine whether all bits have been verified to be set (e.g., written back to second level memory 130) or maximum pulses delivered. If all bits have been verified to be set or maximum pulses delivered, the process moves to block 450. Otherwise the process moves to block 420.

Moving from decision block 440 to block 450, controller 110 may include logic and/or features to cause the continued use of the multi pulse-verification algorithm that started at block 420 in order to narrow cell Vt distributions for the non-volatile memory cells associated with the second set of memory addresses. In some examples, a reset pulse may be asserted on bits for non-volatile memory cells associated with the second set of memory addresses where data=0. A reset pulse count may then be incremented, a reset pulse amplitude and/or a reset pulse width may also be incremented.

Proceeding from block 450 to block 460, controller 110 may include logic and/or features to cause the corrected data in the first level memory 120 to be used to verify bits for the non-volatile memory cell where data=0 and then cause verified bits to be turned off.

Proceeding from block 460 to decision block 470, controller 110 may include logic and/or features to determine whether all bits have been verified to be reset (e.g., written back to second level memory 130) or maximum pulses delivered. If all bits have been verified to be reset or maximum pulses delivered, background write process 400 for the non-volatile memory cell associated with the memory address may be done. If all the bits have not been verified to be reset or maximum pulses delivered, the process moves to block 450.

According to some examples, based on read and write window budget 112, other memory addresses included within the first set of memory addresses via which data was written to as mentioned above for foreground process 300 may be selected for storing data using background write process 400. As a result, eventually all data initially written to the first set of memory addresses may be stored to non-volatile memory cells included in second level memory 130 using background write process 400. This may be beneficial in circumstances where bursts of write requests are received and the periodicity between bursts allows enough time for background write process 400 to be completed on most if not all of the data written to the first set of memory addresses.

In some examples, foreground write process 300 and background write process 400 may represent two different write modes associated with a read and write window budget similar to read and write window budget 112. A first mode may be associated with foreground write process 300 and may be used with a collection of memory addresses where a probability of occurrence of a read or selection error is higher because these memory addresses have not gone through a clean-up process to narrow cell Vt distributions as described for background process 400. Also, a second mode may be associated with background process 400. The second mode may be used with a collection of memory addresses where a probability of occurrence of a read or selection error is lower because these memory addresses have gone through a clean-up process to narrow cell Vt distributions as described for background process 400.

Figure 5:
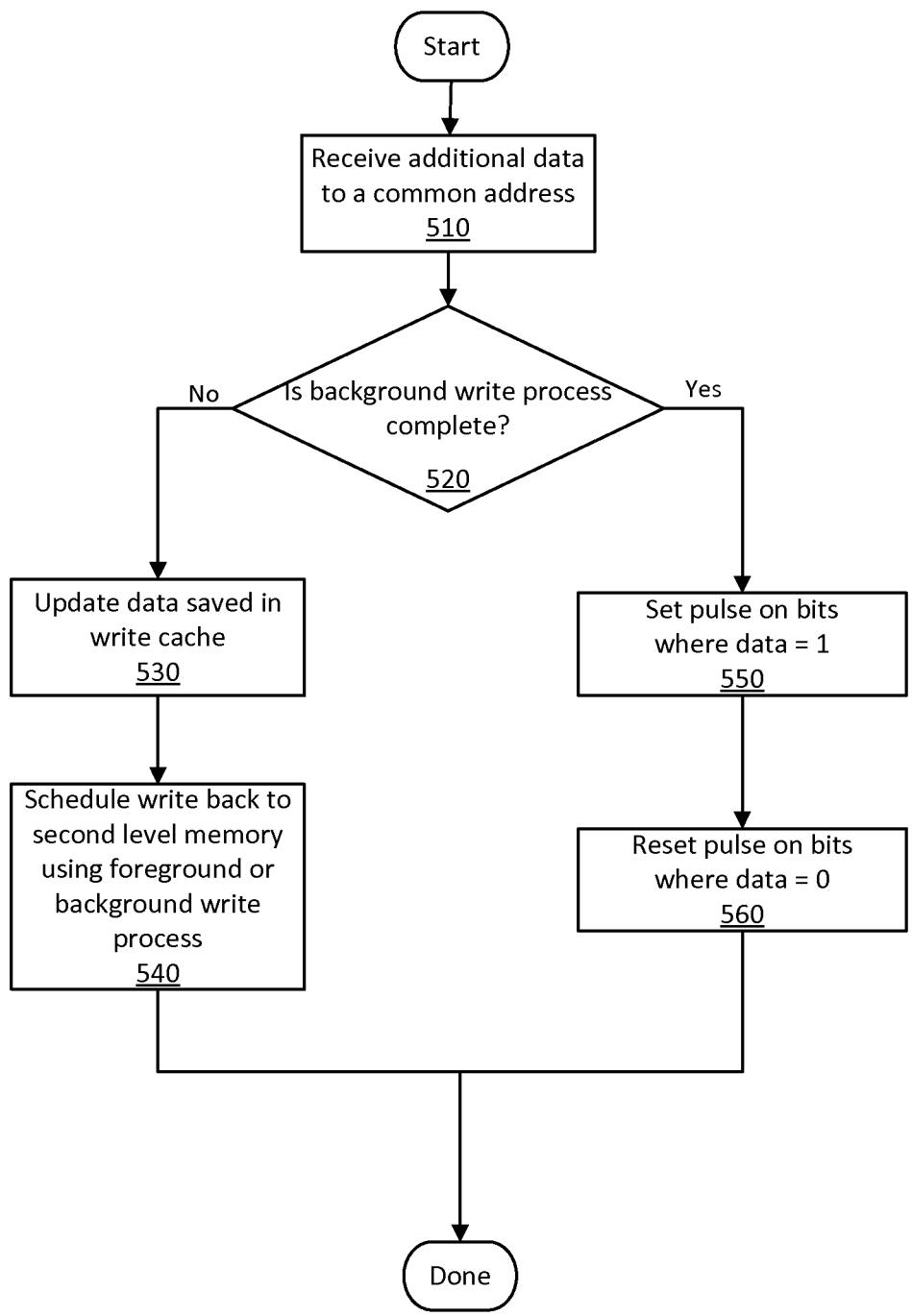
FIG. 5 illustrates an example first write collision process.

FIG. 5 illustrates an example first write collision process 500. In some examples, subsequent write requests may be received by controller 110 to write additional data to 2LM system 100. For these examples, read and write window budget 112 may lead to at least some of the additional data being written to one or more memory addresses via which background process 400 may still be occurring. For example, as mentioned above read and write window budget 112 may cause data to be written to a first set of memory addresses using foreground write process 300 and also written to a second set of memory addresses using background write process 400. According to some examples, when a subsequent write request is serviced by controller 110, read and write window budget 112 may lead to controller 110 causing the additional data to be written to 2LM system 100 using a third set of memory addresses and a fourth set of memory addresses. For these examples, controller 110 may cause the additional data to be written to non-volatile memory cells associated with the third set of memory addresses via use of foreground write process 300. Also, controller 110 may cause at least a portion of the additional data to be written to non-volatile memory cells associated with the fourth set of memory addresses via use of background write process 400.

In some examples, as mentioned previously, background write process 400 may take longer to complete. As a result of taking longer to complete, background write process 400 being used to write data to the second set of memory addresses may still be in process when the request to write the additional data was received. Further, the third set of memory addresses selected for writing the additional data using foreground process 300 may include one or more common memory addresses with the second set of memory addresses. The one or more common memory addresses may lead to a possible write collision.

Moving from the start to block 510, controller 110 may include logic and/or features to recognize that additional data was received and was slated to be written to a common memory address using both foreground write process 300 and background write process 400.

Proceeding from block 510 to decision block 520, controller 110 may include logic and/or features to determine the status of background write process 400 at the non-volatile memory cell associated with the common memory address. If the determined status indicates that background write process 400 was completed, the process moves to block 530. Otherwise, the process moves to block 550.

Moving to from decision block 520 to block 530, controller 110 may include logic and/or features to cause the additional data to be placed or written to the write cache (e.g., write cache 114) being used as part of background write process 400 for the non-volatile memory cell. In some examples, this may result in the data in the write cache being updated.

Proceeding from block 530 to block 540, controller 110 may include logic and/or features to schedule the updated data to be written or stored back to the non-volatile memory cell of the second level memory. In some examples, the updated data may be written back using either foreground write process 300 or background write process 400. The process may then come to an end.

Moving from decision block 520 to block 550, since background write process 400 was found to be completed, the first step in foreground write process 300 may be implemented. In some examples, this includes controller 110 causing a set pulse on bits where data=1 for the non-volatile memory cell.

Proceeding from block 550 to block 560, the second step of foreground write process 300 may be implemented. According to some examples, this includes controller 110 causing a reset pulse on bits where data=0 for the non-volatile memory cell.

As shown in FIG. 5, following block 540 or block 560, the process may be done. In some examples, the process may start over for any other common addresses included in both the second and the third sets of memory addresses.

Figure 6:
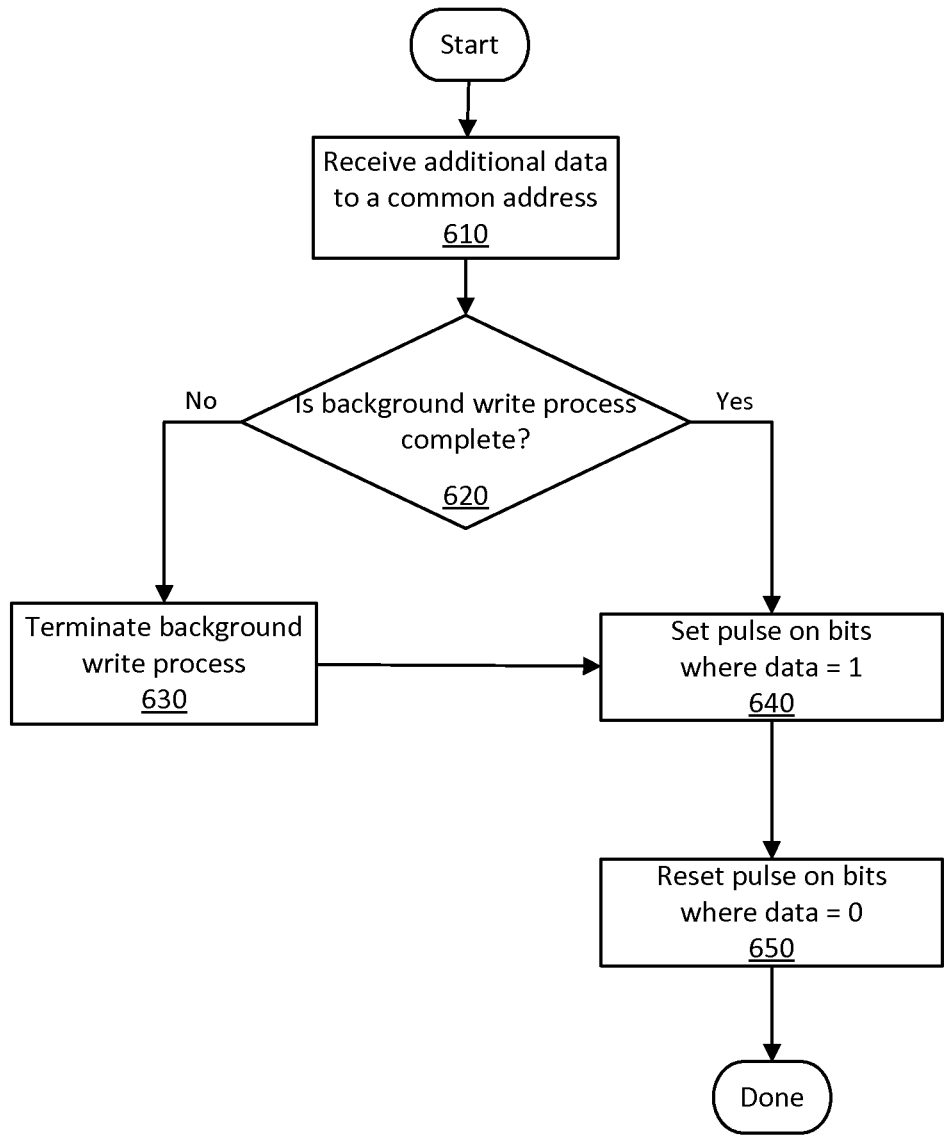
FIG. 6 illustrates an example second write collision process.

FIG. 6 illustrates an example second write collision process 600. In some examples, write collision process 600 may be similar to write collision process 500. The difference between the two write collision processes is that if the status of background write process 400 indicates that background write process 400 is not completed at decision block 620, the process moves to block 630. For these examples, at block 630 controller 110 may include logic and/or features to terminate the partially completed background write process 400. Controller 110 may then cause the additional data to be written to the common memory address using foreground write process 300 as shown at blocks 640 and 650. The process may then be done.

Figure 7:
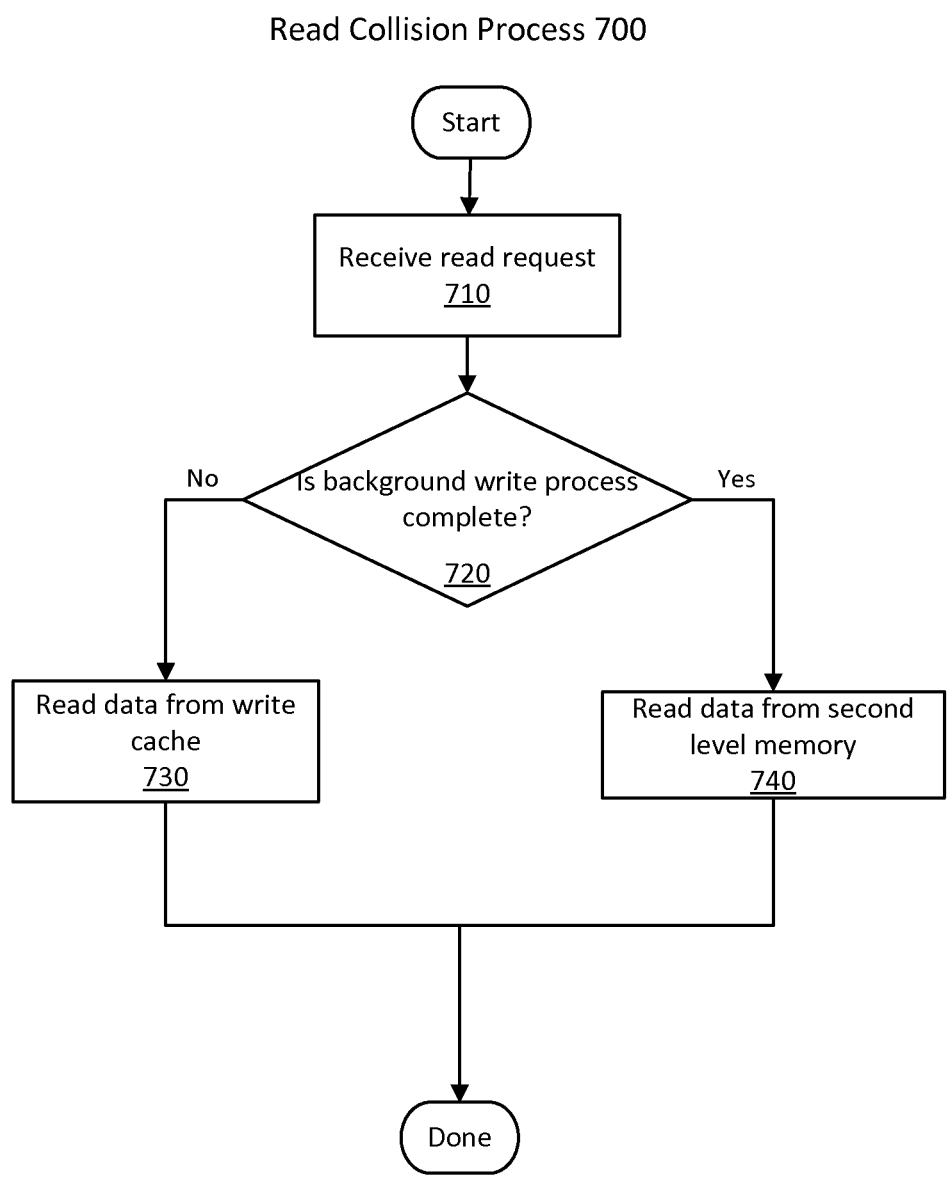
FIG. 7 illustrates an example read collision process.

FIG. 7 illustrates an example read collision process 700. In some examples, a read request may be received by controller 110 to read data from a memory address at second level memory 130. For these examples, the memory address may have been included in those memory addresses selected to have data written to non-volatile memory cells using background write process 400. If background write process 400 is not complete, a read collision may occur for this read request.

Moving from the start to block 710, controller 110 may include logic and/or features to receive a read request from a memory address of 2LM system 100. In some examples, controller 110 may have identified the read request as potentially causing a read collision if the read request was relatively close in time to a write request to a same memory address (e.g., within a few seconds) that was selected for writing using background write process 400.

Proceeding from block 710 to decision block 720, controller 110 may include logic and/or features to determine the status of background write process 400 at the non-volatile memory cell. If the determined status indicates that background write process 400 was not completed, the process moves to block 730. Otherwise, the process moves to block 740.

Moving from decision block 720 to block 730, controller 110 may include logic and/or features to service the read request by causing the data to be read from write cache 114. The data at write cache 114, as mentioned previously, may have been placed in write cache 114 following ECC of the data according to background write process 400.

Moving from decision block 720 to block 740, controller 110 may determine that background write process 400 has been completed. In some examples, because no read collision may occur, controller 110 then causes the data to be read from the non-volatile memory cells in order to service the read request.

As shown in FIG. 7, following block 730 or block 740, the process may be done. In some examples, the process may start over if another potential read collision is identified by controller 110.

Figure 8:
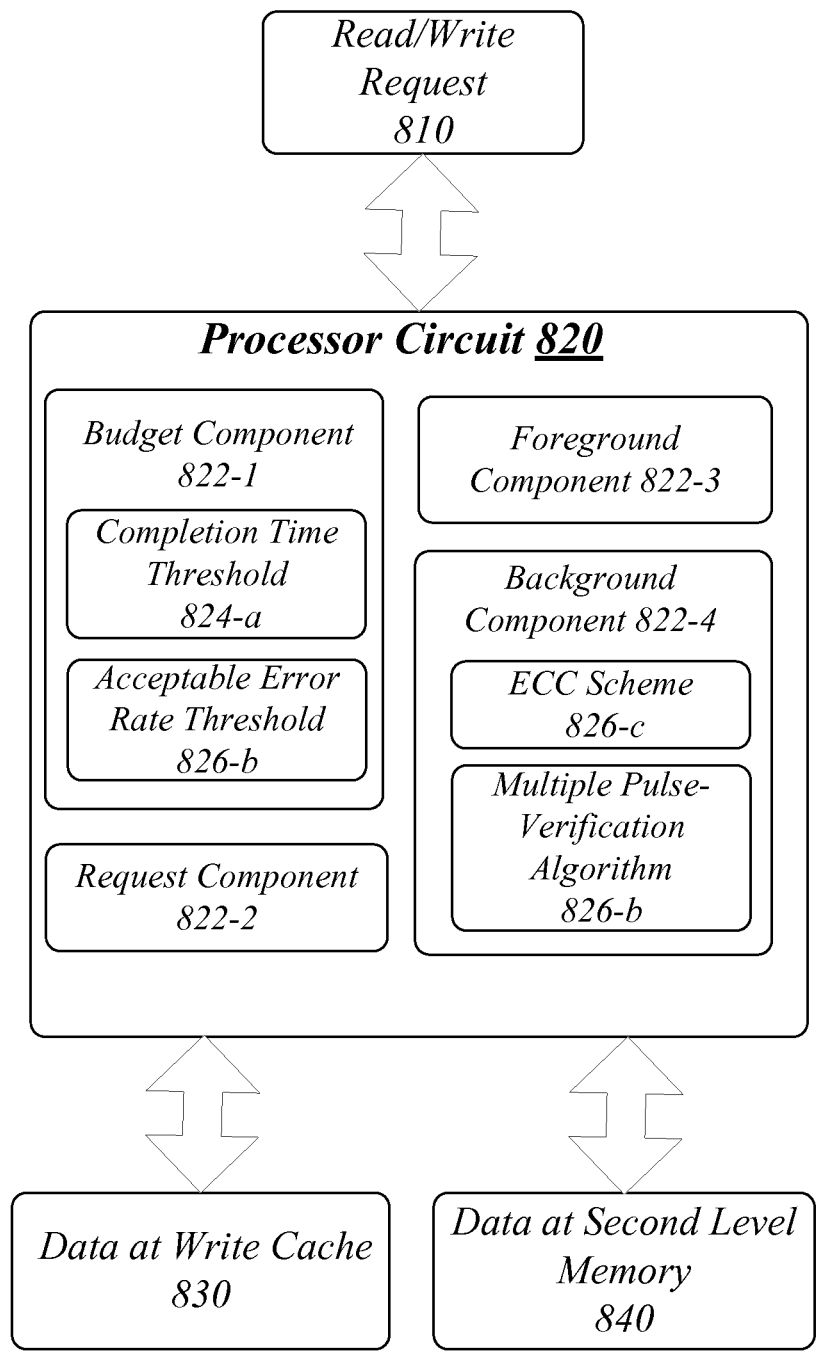
FIG. 8 illustrates an example apparatus.

FIG. 8 illustrates an example apparatus 800. Although the apparatus 800 shown in FIG. 8 has a limited number of elements in a certain topology, it may be appreciated that the apparatus 800 may include more or less elements in alternate topologies as desired for a given implementation.

The apparatus 800 may comprise a computer-implemented apparatus that may include at least some of the logic and/or features mentioned above for controller 110 for FIGS. 1-7. The computer-implemented apparatus 800 may be arranged to execute one or more software components 822-*a*. It is worthy to note that "a" and "b" and "c" and similar designators as used herein are intended to be variables representing any positive integer. Thus, for example, if an implementation sets a value for a=5, then a complete set of software components 822-*a* may include modules 822-1, 822-2, 822-3, 822-4 or 822-5. The embodiments are not limited in this context.

According to some examples, apparatus 800 may be capable of being located with a computing device, e.g., as part of a 2LM system such as 2LM system 100. For these examples, apparatus 800 may be included in or implemented by a processor or processor circuitry. In other examples, apparatus 800 may be implemented as part of firmware (e.g., BIOS), or implemented as a middleware application. The examples are not limited in this context.

In some examples, if implemented in a processor, the processor may be generally arranged to execute one or more software components 822-*a*. The processor can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Core i3, Core i5, Core i7, Pentium®, and XScale® processors; and similar processors. Multi-core processors and other multi-processor architectures may also be employed to implement apparatus 800.

According to some examples, apparatus 800 may include a budget component 822-1. Budget component 822-1 may be arranged for execution by processor circuit 820 to establish a read and write window budget for a 2LM system such as read and write window budget 112 mentioned above. For these examples, the read and write window budget may be established based on meeting completion time thresholds and acceptable error rate thresholds. These thresholds may be at least temporarily maintained by budget component 822-1 (e.g., stored in a data structure such as a lookup table (LUT). The thresholds may include completion time threshold 824-*a* and acceptable error rate threshold 825-*b*. Completion time threshold 824-*a* may indicate a completion time threshold for a given amount of memory and acceptable error rate threshold 825-*a* may indicate an acceptable error rate threshold for the given amount of memory.

In some examples, apparatus 800 may also include a request component 822-2. Request component 822-2 may be arranged for execution by processor circuit 820 to receive a read/write request 810. According to some examples, read/write request 810 may include a request to write data to the 2LM system. Request component 822-2 may also be arranged to cause the data to be written to the non-volatile memory cells included in a second level memory of the 2LM system (e.g., second level memory 130) according to the read and write window budget (e.g., read and write window budget 112) established by budget component 822-1.

In some examples, apparatus 800 may also include a foreground component 822-3. Foreground component 822-3 may be arranged for execution by processor circuit 820 to use a foreground write process such as foreground write process 300 to cause data associated with read/write request 810 to be written to non-volatile memory cells (e.g., associated with a first set of memory addresses) included in the second level memory of the 2LM system. The movement of the data that is caused to be written by foreground component 822-3 is depicted in FIG. 8 as data at second level memory 840.

According to some examples, apparatus 800 may also include a background component 822-4. Background component 822-4 may be arranged for execution by processor circuit 820 to use a background write process such as background write process 400 to cause at least a portion of the data associated with read/write request 810 to be written to non-volatile memory cells (e.g., associated with a second set of memory addresses) included in the second level memory of the 2LM system. The movement of the data that is caused to be written by background component 822-4 is depicted in FIG. 8 as data at second level memory 840.

In some examples, as mentioned above for background write process 400, data may be written to non-volatile memory cells included in the second level memory via implementation of an ECC scheme such as ECC scheme 826-*c* and use of a multiple pulse-verification algorithm such as multiple pulse-verification algorithm 827-*d*. For these examples, ECC scheme 826-*c* and multiple pulse verification algorithm 827-*d* may be at least temporarily maintained by background component 822-4 (e.g., stored in a data structure such as a LUT). ECC scheme 826-*c* may include ECC schemes such as, but not limited to, Reed-Solomon and multiple pulse verification algorithm 827-4 may include at least the portion of background write process 400 described for blocks 420 to 470 for FIG. 4. Also as mentioned above, as part of the background write process, data may be at least temporarily stored at or written to a write cache. The movement of the data to the write cache by background component 822-4 is depicted in FIG. 8 as data at write cache 830.

According to some examples, the double-arrows between processor circuit 820 and data at second level memory 840 may indicate that data may be either read from or written to the 2LM system. In some examples, read or write collisions may cause components of processor circuit 820 to read from data at write cache 830 and/or from data at second level memory 840. These components may read the data while implementing write collision processes such as write collision processes 500 or 600. These components of processor circuit 820 may also read the data responsive to read requests included in read/write request 810 or while implementing read collision processes such as read collision process 700. Also, background component 822-4 may cause data to be read from data at write cache 830 as part of using the background write process.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 9:
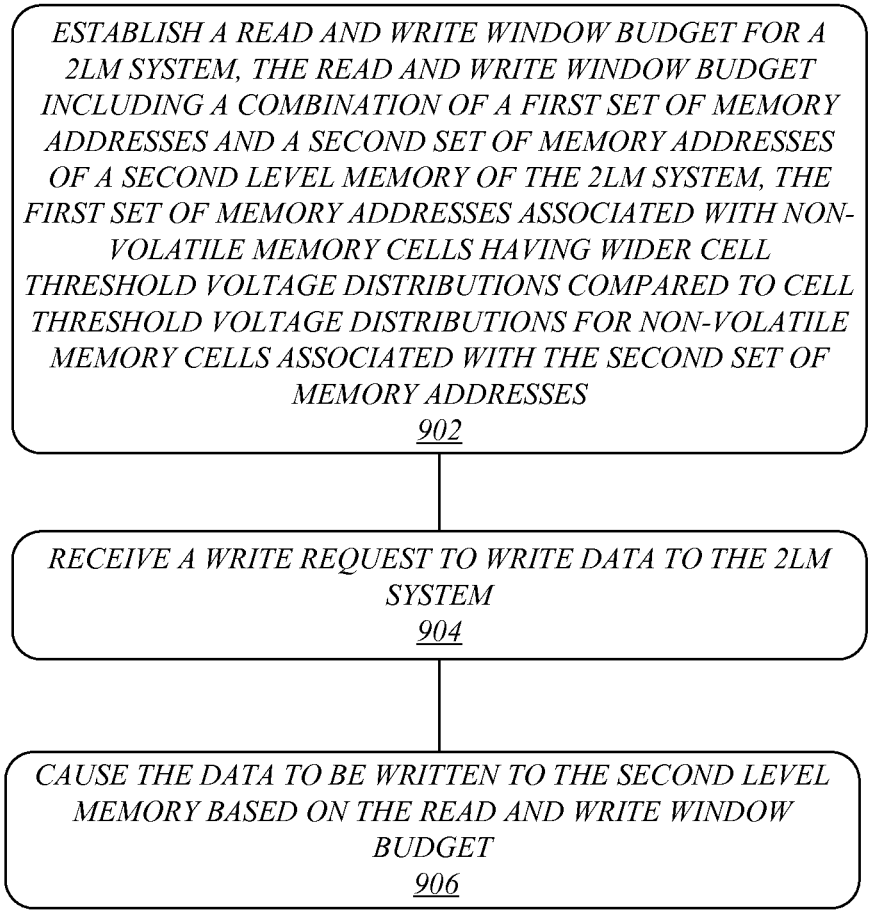
FIG. 9 illustrates an example logic flow.

FIG. 9 illustrates a logic flow 900. Logic flow 900 may be representative of some or all of the operations executed by one or more logic, features, or devices described herein, such as apparatus 800. More particularly, logic flow 900 may be implemented by budget component 822-1, request component 822-2, foreground component 822-3 or background component 822-4.

According to some examples, logic flow 900 may establish a read and write window budget for a 2LM system at block 902. The read and write window budget may include a combination of a first set of memory addresses and a second set of memory addresses of a second level memory of the 2LM system. The first set of memory addresses may be associated with non-volatile memory cells having wider cell Vt distributions compared to cell Vt distributions for non-volatile memory cells associated with the second set of memory addresses. For these examples, the read and write window budget may be established by budget component 822-1 and may be similar to read and write window budget 112 as described previously for 2LM system 100.

In some examples, logic flow 900 may receive a write request to write data to the 2LM system at block 904. For these examples, request component 822-2 may receive the write request from an operating system of a computing device that includes 2LM system 100.

According to some examples, logic flow 900 may cause the data to be written to the second level memory based on the read and write window budget at block 906. For these examples, both foreground component 822-3 and background component 822-4 may cause the data included in the write request to be written to non-volatile memory cells associated with the first and second memory addresses. Foreground component 822-3 may utilize foreground write process 300 to cause data to be written to the non-volatile memory cells. Background component 822-4 may utilize background write process 400 to cause at least a portion of the data to be written to at least a portion of the non-volatile memory cells.

FIG. 10 illustrates an embodiment of a storage medium 1000. The storage medium 1000 may comprise an article of manufacture. In some examples, storage medium 1000 may include any non-transitory computer readable medium or machine readable medium, such as an optical, magnetic or semiconductor storage. Storage medium 1000 may store various types of computer executable instructions, such as instructions to implement logic flow 900. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

FIG. 11 illustrates an example computing platform 1100. In some examples, as shown in FIG. 11, computing platform 1100 may include a 2LM system 1130, a processing component 1140, other platform components 1050 or a communications interface 1160. According to some examples, computing platform 1100 may be implemented in a computing device.

According to some examples, 2LM system 1130 may be similar to 2LM system 100. For these examples, logic and/or features (e.g., included in a controller) resident at or located with 2LM system 1130 may execute at least some processing operations or logic for apparatus 800. Also, 2LM system 1130 may include first and second levels of memory (not shown) that may be written to or read from in a similar manner as described above for 2LM system 100 based on read and write window budget 112.

According to some examples, processing component 1140 may also execute at least some processing operations or logic for apparatus 800 and/or storage medium 1000. Processing component 1140 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1150 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 1150 or 2LM system 1130 may include without limitation, various types of computer readable and machine readable storage media in the form of one or more higher speed memory units, such as read-only memory (ROM), RAM, DRAM, Double-Data-Rate DRAM (DDRAM), synchronous DRAM (SDRAM), SRAM, programmable ROM (PROM), erasable programmable ROM (EPROM), electrically erasable programmable ROM (EEPROM), flash memory, phase change memory (PCM), phase change memory and switch (PCMS), polymer memory such as ferroelectric polymer memory, nanowire, ferroelectric transistor random access memory (FeRAM), ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 1160 may include logic and/or features to support a communication interface. For these examples, communications interface 1160 may include one or more communication interfaces that operate according to various communication protocols or standards to communicate over direct or network communication links. Direct communications may occur via use of communication protocols or standards described in one or more industry standards (including progenies and variants) such as those associated with the System Management Bus (SMBus) specification, the PCI Express specification, the Serial Advanced Technology Attachment (SATA) specification or the Universal Serial Bus (USB) specification. Network communications may occur via use of communication protocols or standards such those described in the Ethernet standard.

Computing platform 1100 may be part of a computing device that may be, for example, user equipment, a computer, a personal computer (PC), a desktop computer, a laptop computer, a notebook computer, a netbook computer, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1100 described herein, may be included or omitted in various embodiments of computing platform 1100, as suitably desired.

The components and features of computing platform 1100 may be implemented using any combination of discrete circuitry, application specific integrated circuits (ASICs), logic gates and/or single chip architectures. Further, the features of computing platform 1100 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing platform 1100 shown in the block diagram of FIG. 11 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

In some examples, example methods may include establishing a read and write window budget for a 2LM system including a first level memory and a second level memory. The read and write window budget may include a combination of a first set of memory addresses and a second set of memory addresses of the second level memory of the 2LM system. The first set of memory addresses associated with non-volatile memory cells having wider cell threshold voltage distributions compared to cell threshold voltage distributions for non-volatile memory cells associated with the second set of memory addresses. For these examples, a write request may be received to write data to the 2LM system. Data may then be caused to be written to the second level memory based on the read and write window budget.

According to some examples for the example methods, the non-volatile memory cells associated with the first set of memory addresses may store the data via use of a foreground write process that includes no error correction.

In some examples for the example methods, the non-volatile memory cells associated with the second set of memory addresses may store at least a portion of the data via use of a background write process. For these examples the background write process includes implementing an ECC scheme for the at least portion of the data written to the non-volatile memory cells associated with the second set of memory address via use of the foreground write process. The background write process also included causing the at least portion of the data to be stored in a write cache separate from the second level memory following implementation of the ECC scheme. The background write process also includes causing the at least portion of the data to be written back to the non-volatile memory cells associated with the second set of memory addresses using a multiple pulse-verification algorithm. The multiple pulse-verification algorithm may be capable of narrowing cell threshold voltage distributions for the memory cells associated with the second set of memory addresses compared to the cell threshold voltage distributions for the non-volatile memory cells associated with the first set of memory addresses.

According to some examples for the example methods, a subsequent write request to write additional data may be received. The additional data may be caused to be written to the second level memory based on the read and write window budget. The additional data may be written to non-volatile memory cells associated with a third set of memory addresses via use of the foreground write process. Also, at least some of the additional data may be written to non-volatile memory cells associated with a fourth set of memory addresses via use of the background write process. For these examples, the second set of memory addresses may be different than the fourth set of memory addresses.

In some examples for the example methods, the third set of memory addresses and the second set of memory addresses may include at least one common memory address. Writing the additional data in a non-volatile memory cell associated with the at least one common memory address may include determining a status of the background write process to the non-volatile memory cell for writing data associated with the previously received write request and causing the additional data to be written to the second level memory based on the status of the background write process.

According to some examples for the example methods, the status of the background write process may indicate completion of the background write process. For these examples, the additional data caused to be written to the second level memory may include writing the additional data to the non-volatile memory cell using the foreground write process.

In some examples for the example methods, the status of the background write process may indicate partial completion of the background write process. For these examples, the additional data may be caused to be written to the second level memory by causing the additional data to update data associated with the previously received write request that was written to the write cache as a result of the partially completed background write process. Also, the updated data may be scheduled to be written to the non-volatile memory cell in the second level memory. The updated data may then be caused to be written to the non-volatile memory cell in the second level memory using the foreground write process or the background write process.

According to some examples for the example methods, a read request may be received to read data from a memory address included in the second set of memory addresses. A status of the background write process for writing the data associated with the received write request to a non-volatile memory cell associated with the memory address may be determined. The data may then be caused to be read based on the status of the background write process.

In some examples for the example methods, the status of the background write process may indicate completion of the background write process. For these examples, causing the data to be read may include causing the data to be read from the non-volatile memory cell associated with the memory address.

According to some examples for the example methods, the status of the background write process may indicate partial completion of the background write process. For these examples, causing the data to be read may include causing the data to be read from the write cache used to at least partially complete the background write process for data stored at the non-volatile memory cell associated with the memory address.

In some examples for the example methods, the read and write window budget may be established based on meeting both a completion time threshold for a given amount of memory and an acceptable error rate threshold for the given amount of memory when fulfilling read or write requests to the second level memory. Also, the foreground write process may have a faster completion time compared to background write process. The background write process may have lower errors compared to the foreground write process.

In some examples for the example methods, the non-volatile memory cells may include one of PCM, PCMS, NAND flash memory, NOR flash memory or ferroelectric memory.

According to some examples for the example methods, the first level memory of the 2LM system may be volatile memory to include one of dynamic random access memory or static random access memory.

According to some examples, at least one machine readable medium comprising a plurality of instructions that in response to being executed on a system cause the system to carry out the example method as mentioned above.

According to some examples, an example apparatus may include a processor circuit and a budget component arranged for execution by the processor circuit to establish a read and write window budget for a 2LM system including a first level memory and a second level memory. The read and write window budget may include a combination of a first set of memory addresses and a second set of memory addresses of the second level memory of the 2LM system. The first set of memory addresses may be associated with non-volatile memory cells having wider cell threshold voltage distributions compared to cell threshold voltage distributions for non-volatile memory cells associated with the second set of memory addresses. The example apparatus may also include a request component arranged for execution by the processor circuit to receive a write request to write data to the 2LM system. The request component may also be arranged to cause the data to be written to the second level memory based on the established read and write window budget.

In some examples, the example apparatus may also include a foreground component arranged for execution by the processor circuit to use a foreground write process to cause the data to be written to the non-volatile memory cells associated with the first set of memory addresses. For these examples, the foreground write process may include no error correction.

In some examples, the example apparatus may also include a background component arranged for execution by the processor circuit to use a background write process to cause at least a portion of the data to be written to the non-volatile memory cells associated with the second set of memory addresses. For these examples, use of the background write process may include the background component being arranged to implement an ECC scheme for the at least portion of the data written to the non-volatile memory cells associated with the second set of memory addresses via use of the foreground write process. Use of the background write process may also include the at least portion of the data to be caused to be stored in a write cache separate from the second level memory following implementation of the ECC scheme. Use of the background write process may also include the at least portion of the data to be caused to be written back to the non-volatile memory cells associated with the second set of memory addresses using a multiple pulse-verification algorithm. The multiple pulse-verification algorithm capable of narrowing cell threshold voltage distributions for the memory cells associated with the second set of memory addresses compared to the cell threshold voltage distributions for the non-volatile memory cells associated with the first set of memory addresses.

According to some examples for the example apparatus, the request component may be arranged to receive a subsequent write request to write additional data and cause the additional data to be written to the second level memory based on the read and write window budget. The additional data may be written to non-volatile memory cells associated with a third set of memory addresses and at least a portion of the additional data may be written to non-volatile memory cells associated with a fourth set of memory addresses. For these examples, the foreground component may be arranged to use the foreground write process to cause the additional data to be written to the non-volatile memory cells associated with the third set of memory addresses. Also, for these examples, the background component may be arranged to use the background write process to cause the at least portion of the additional data to be written to the non-volatile memory cells associated with the fourth set of memory addresses.

In some examples for the example apparatus, the third set of memory addresses and the second set of memory addresses may include at least one common memory address associated with a non-volatile memory cell. For these examples, the request component may be arranged to cause the additional data to be written to the non-volatile memory cell by being arranged to determine a status of the background write process used by the background component in order to cause the data associated with the previously received write request to be written to the non-volatile memory cell. The request component may also be arranged to cause the additional data to be written to the non-volatile memory cell based on the status of the background write process.

According to some examples for the example apparatus, the status of the background write process may indicate that the background component has completed the background write process for writing the data associated with the previously received write request to the at least one common memory address associated with the non-volatile memory cell. For these examples, the request component may also be arranged to have the additional data caused to be written to the non-volatile memory cell by the foreground component. The foreground component may cause the additional data to be written to the non-volatile memory cell using the foreground write process.

In some examples for the example apparatus, the status of the background write process may indicate that the background component has partially completed the background write process for writing the data associated with the previously received write request to the at least one common memory address associated with the non-volatile memory cell. For these examples, the request component may also be arranged to have the additional data written to the second level memory by causing the additional data to update data associated with the previously received write request that was caused to be written to the write cache by the background component as a result of the background component partially completing the background write process. The request component may also be arranged to schedule the additional data to be written to the non-volatile memory cell in the second level memory. The request component may also be arranged to cause the foreground component to cause the additional data from the write cache to be written to the non-volatile memory cell in the second level memory using the foreground write process. Alternatively, the request component may also be arranged to cause the background component to cause the additional data from the first level memory to be written to the non-volatile memory cell in the second level memory using the background write process.

According to some examples for the example apparatus, the budget component may be arranged to establish the read and write window budget based on meeting both a completion time threshold for a given amount of memory and an acceptable error rate threshold for the given amount of memory when fulfilling read or write requests to the second level memory. The foreground write process may have a faster completion time compared to background write process. The background write process may have lower errors compared to the foreground write process.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
    establishing a read and write window budget for a two level memory (2LM) system including a first level memory and a second level memory, the read and write window budget including a combination of a first set of memory addresses and a second set of memory addresses of the second level memory, the first set of memory addresses associated with non-volatile memory cells having wider cell threshold voltage distributions compared to cell threshold voltage distributions for non-volatile memory cells associated with the second set of memory addresses;
    receiving a write request to write data to the 2LM system; and
    causing the data to be written to the second level memory based on the read and write window budget.

2. The method of claim 1, comprising the non-volatile memory cells associated with the first set of memory addresses to store the data via use of a foreground write process that includes no error correction.

3. The method of claim 2, comprising the non-volatile memory cells associated with the second set of memory addresses to store at least a portion of the data via use of a background write process that includes:
    implementing an error correction code (ECC) scheme for the at least portion of the data written to the non-volatile memory cells associated with the second set of memory address via use of the foreground write process;
    causing the at least portion of the data to be stored in a write cache separate from the second level memory following implementation of the ECC scheme; and
    causing the at least portion of the data to be written back to the non-volatile memory cells associated with the second set of memory addresses using a multiple pulse-verification algorithm capable of narrowing cell threshold voltage distributions for the memory cells associated with the second set of memory addresses compared to the cell threshold voltage distributions for the non-volatile memory cells associated with the first set of memory addresses.

4. The method of claim 3, comprising:
receiving a subsequent write request to write additional data; and
causing the additional data to be written to the second level memory based on the read and write window budget, the additional data to be written to non-volatile memory cells associated with a third set of memory addresses via use of the foreground write process and at least some of the additional data to be written to non-volatile memory cells associated with a fourth set of memory addresses via use of the background write process.

5. The method of claim 4, comprising the second set of memory addresses being different than the fourth set of memory addresses.

6. The method of claim 4, comprising the third set of memory addresses and the second set of memory addresses including at least one common memory address and writing the additional data to a non-volatile memory cell associated with the at least one common memory address includes:
determining a status of the background write process to the non-volatile memory cell for writing data associated with the previously received write request; and
causing the additional data to be written to the second level memory based on the status of the background write process.

7. The method of claim 6, comprising the status of the background write process indicating completion of the background write process and causing the additional data to be written to the second level memory includes writing the additional data to the non-volatile memory cell using the foreground write process.

8. The method of claim 6, comprising the status of the background write process indicating partial completion of the background write process and causing the additional data to be written to the second level memory to include:
causing the additional data to update data associated with the previously received write request that was written to the write cache as a result of the partially completed background write process;
scheduling the updated data to be written to the non-volatile memory cell in the second level memory; and
using the foreground write process or the background write process to cause the updated data to be written to the non-volatile memory cell in the second level memory.

9. The method of claim 3, comprising:
receiving a read request to read data from a memory address included in the second set of memory addresses;
determining a status of the background write process for writing the data associated with the received write request to a non-volatile memory cell associated with the memory address; and
causing the data to be read based on the status of the background write process.

10. The method of claim 9, comprising the status of the background write process indicating completion of the background write process and causing the data to be read includes causing the data to be read from the non-volatile memory cell associated with the memory address.

11. The method of claim 9, comprising the status of the background write process indicating partial completion of the background write process and causing the data to be read includes causing the data to be read from the write cache used to at least partially complete the background write process for data stored at the non-volatile memory cell associated with the memory address.

12. The method of claim 3, comprising establishing the read and write window budget based on meeting both a completion time threshold for a given amount of memory and an acceptable error rate threshold for the given amount of memory when fulfilling read or write requests to the second level memory, the foreground write process having a faster completion time compared to background write process, the background write process having lower errors compared to the foreground write process.

13. The method of claim 1, comprising the non-volatile memory cells to include one of phase change memory, phase change memory and switch, NAND flash memory, NOR flash memory or ferroelectric memory.

14. The method of claim 1, the first level memory of the 2LM system comprising volatile memory to include one of dynamic random access memory or static random access memory.

15. An apparatus at a wireless device comprising:
a processor circuit;
a budget component arranged for execution by the processor circuit to establish a read and write window budget for a two level memory (2LM) system including a first level memory and a second level memory, the read and write window budget including a combination of a first set of memory addresses and a second set of memory addresses of the second level memory, the first set of memory addresses associated with non-volatile memory cells having wider cell threshold voltage distributions compared to cell threshold voltage distributions for non-volatile memory cells associated with the second set of memory addresses; and
a request component arranged for execution by the processor circuit to receive a write request to write data to the 2LM system, the request component also arranged to cause the data to be written to the second level memory based on the established read and write window budget.

16. The apparatus of claim 15, comprising:
a foreground component arranged for execution by the processor circuit to use a foreground write process to cause the data to be written to the non-volatile memory cells associated with the first set of memory addresses, the foreground write process to include no error correction; and
a background component arranged for execution by the processor circuit to use a background write process to cause at least a portion of the data to be written to the non-volatile memory cells associated with the second set of memory addresses, use of the background write process to include the background component being arranged to:
implement an error correction code (ECC) scheme for the at least portion of the data written to the non-volatile memory cells associated with the second set of memory addresses via use of the foreground write process;
cause the at least portion of the data to be stored to a write cache separate from the second level memory following implementation of the ECC scheme; and
cause the at least portion of the data to be written back to the non-volatile memory cells associated with the second set of memory addresses using a multiple pulse-verification algorithm capable of narrowing cell threshold voltage distributions for the memory cells associated with the second set of memory addresses compared to the cell threshold voltage distributions for the non-volatile memory cells associated with the first set of memory addresses.

17. The apparatus of claim 16, comprising:
the request component arranged to receive a subsequent write request to write additional data and cause the additional data to be written to the second level memory based on the read and write window budget, the additional data to be written to non-volatile memory cells associated with a third set of memory addresses and at least a portion of the additional data to be written to non-volatile memory cells associated with a fourth set of memory addresses;
the foreground component arranged to use the foreground write process to cause the additional data to be written to the non-volatile memory cells associated with the third set of memory addresses; and
the background component arranged to use the background write process to cause the at least portion of the additional data to be written to the non-volatile memory cells associated with the fourth set of memory addresses.

18. The apparatus of claim 16, comprising the third set of memory addresses and the second set of memory addresses including at least one common memory address associated with a non-volatile memory cell, the request component arranged to cause the additional data to be written to the non-volatile memory cell to include the request component also arranged to:
determine a status of the background write process used by the background component to cause the data associated with the previously received write request to be written to the non-volatile memory cell; and
cause the additional data to be written to the non-volatile memory cell based on the status of the background write process.

19. The apparatus of claim 18, comprising the status of the background write process indicating that the background component has completed the background write process for writing the data associated with the previously received write request to the at least one common memory address associated with the non-volatile memory cell, the request component also arranged to have the additional data caused to be written to the non-volatile memory cell by the foreground component, the foreground component to cause the additional data to be written to the non-volatile memory cell using the foreground write process.

20. The apparatus of claim 18, comprising the status of the background write process indicating that the background component has partially completed the background write process for writing the data associated with the previously received write request to the at least one common memory address associated with the non-volatile memory cell, the request component also arranged to have the additional data written to the second level memory by:
causing the additional data to update data associated with the previously received write request that was caused to be written to the write cache by the background component as a result of the background component partially completing the background write process;
scheduling the additional data to be written to the non-volatile memory cell in the second level memory; and
causing the foreground component to cause the additional data from the write cache to be written to the non-volatile memory cell in the second level memory using the foreground write process or cause the background component to cause the additional data from the write cache to be written to the non-volatile memory cell in the second level memory using the background write process.

21. The apparatus of claim 16, comprising the budget component arranged to establish the read and write window budget based on meeting both a completion time threshold for a given amount of memory and an acceptable error rate threshold for the given amount of memory when fulfilling read or write requests to the second level memory, the foreground write process to have a faster completion time compared to background write process, the background write process to have lower errors compared to the foreground write process.

22. At least one non-transitory machine readable medium comprising a plurality of instructions that in response to being executed on a system cause the system to:
establish a read and write window budget for a two level memory (2LM) system including a first level memory and a second level memory, the read and write window budget including a combination of a first set of memory addresses and a second set of memory addresses of the second level memory, the first set of memory addresses associated with non-volatile memory cells configured to have wider cell threshold voltage distributions compared to cell threshold voltage distributions for non-volatile memory cells associated with the second set of memory addresses;
receive a write request to write data to the 2LM system; and
cause the data to be written to the second level memory based on the read and write window budget.

23. At least one non-transitory machine readable medium of claim 22, the plurality of instructions to also cause the system to:
cause the data to be written to the non-volatile memory cells associated with the first set of memory addresses via use of a foreground write process that includes no error correction; and
cause at least a portion of the data to be written to the non-volatile memory cells associated with the second set of memory addresses via use of a background write process, the background write process to cause the system to:
implement an error correction code (ECC) scheme for the at least portion of the data written to the non-volatile memory cells associated with the second set of memory address via use of the foreground write process;
store the at least portion of the data in a write cache separate from the second level memory following implementation of the ECC scheme; and
write back the at least portion of the data to the non-volatile memory cells associated with the second set of memory addresses using a multiple pulse-verification algorithm capable of narrowing cell threshold voltage distributions for the memory cells associated with the second set of memory addresses compared to the cell threshold voltage distributions for the non-volatile memory cells associated with the first set of memory addresses.

24. At least one non-transitory machine readable medium of claim 23, comprising the system to establish the read and write window budget based on meeting both a completion time threshold for a given amount of memory and an acceptable error rate threshold for the given amount of memory when fulfilling read or write requests to the second level memory, the foreground write process having a faster completion time compared to background write process, the background write process having lower errors compared to the foreground write process.

* * * * *